United States Patent [19]

Kosmowski et al.

[11] Patent Number: 4,824,310
[45] Date of Patent: Apr. 25, 1989

[54] AUTOMATED WORK-PIECE HANDLING SYSTEM FOR MACHINE TOOL

[76] Inventors: Wojciech B. Kosmowski, 26392 Calle Roberto, San Juan Capistrano, Calif. 92675; Sabatino Capaldi, 30215 Via Victoria, Rancho Palos Verdes, Calif. 90274

[21] Appl. No.: 928,628

[22] Filed: Nov. 5, 1986

Related U.S. Application Data

[63] Continuation of Ser. No. 773,502, Sep. 4, 1985, abandoned, which is a continuation of Ser. No. 470,457, Feb. 28, 1983, abandoned.

[51] Int. Cl.⁴ ............................................. B65G 65/00
[52] U.S. Cl. ..................................... 414/222; 414/17; 414/19; 414/331; 414/750; 198/774
[58] Field of Search ................. 414/14, 17, 19, 20, 414/32, 111, 114, 118, 119, 222–225, 331, 582, 749–752; 198/772, 774

[56] References Cited

U.S. PATENT DOCUMENTS

| | | | |
|---|---|---|---|
| 201,049 | 5/1878 | Robertson | 414/331 X |
| 1,756,584 | 4/1930 | Cope | 198/772 X |
| 1,852,221 | 4/1932 | Snow | 414/19 |
| 2,452,927 | 11/1948 | Hammen | 414/222 X |
| 2,459,524 | 1/1949 | Hanson | 414/331 |
| 2,595,015 | 4/1952 | Sparks | 414/118 X |
| 2,656,047 | 10/1953 | Samler | 414/222 X |
| 2,931,524 | 4/1960 | Hallenius | 198/772 X |
| 3,006,458 | 10/1961 | Spiazzi | 198/772 |
| 3,314,554 | 4/1967 | Cuniberti | 198/486 X |
| 3,401,807 | 9/1968 | Larkin | 414/753 X |
| 3,528,575 | 9/1970 | McCaughey | 414/751 X |
| 3,655,070 | 4/1972 | Haydu | 198/486 X |
| 3,749,385 | 7/1973 | Ogawa | 266/23 B |
| 3,902,615 | 9/1975 | Levy et al. | 414/331 |
| 3,960,280 | 6/1976 | Stolzer | 414/114 |
| 4,014,428 | 3/1977 | Ossbahr | 198/345 |
| 4,277,216 | 7/1981 | Lindberg | 414/331 |
| 4,279,560 | 7/1981 | Ito | 414/589 |
| 4,316,693 | 2/1982 | Baxter | 414/59 |
| 4,331,229 | 5/1982 | Kamm | 198/345 |
| 4,373,840 | 2/1983 | Miller, Jr. | 414/751 X |
| 4,373,846 | 2/1983 | Charbonnet | 414/331 |
| 4,405,277 | 9/1983 | Bürkner | 414/749 X |
| 4,427,332 | 1/1984 | Manriquez | 414/331 |
| 4,578,010 | 3/1986 | Harigane et al. | 414/226 X |
| 4,588,343 | 5/1986 | Garrett | 414/222 X |
| 4,610,595 | 9/1986 | Hockersmith | 414/222 |
| 4,621,969 | 11/1986 | Berghäll et al. | 414/331 |
| 4,634,333 | 1/1987 | Butterly, Jr. et al. | 414/331 |

Primary Examiner—Robert J. Spar
Assistant Examiner—Donald W. Underwood
Attorney, Agent, or Firm—Spensley Horn Jubas & Lubitz

[57] ABSTRACT

An automated workpiece handling system for use with a machine tool having a plurality of workstations spaced along a longitudinally movable, elongate workpiece comprising a first cart for transporting workpieces to one end of the tooling machine, adjacent a first workstation, a first feeder mechanism on the machine tool for drawing workpieces from the first cart and delivering the workpieces onto the worktable, a mechanism on the worktable including the worktable itself for moving the workpieces along the worktable from a position adjacent the first workstation to a position adjacent a final workstation, a second cart for transporting workpieces from the other end of the machine tool, adjacent the final workstation, and a second feeder mechanism on the machine tool for drawing workpieces from the worktable and delivering the workpieces onto the second cart.

13 Claims, 6 Drawing Sheets

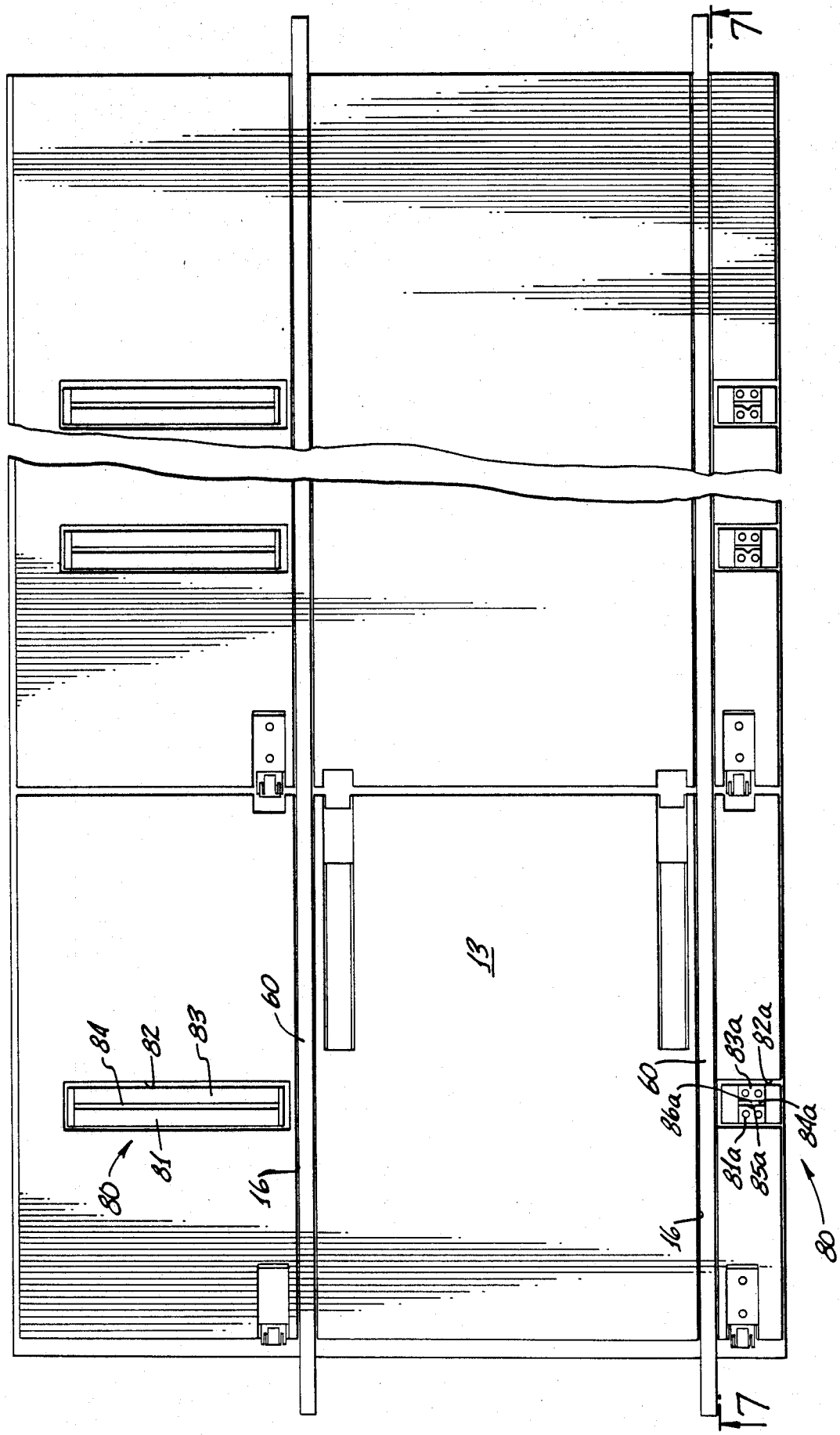

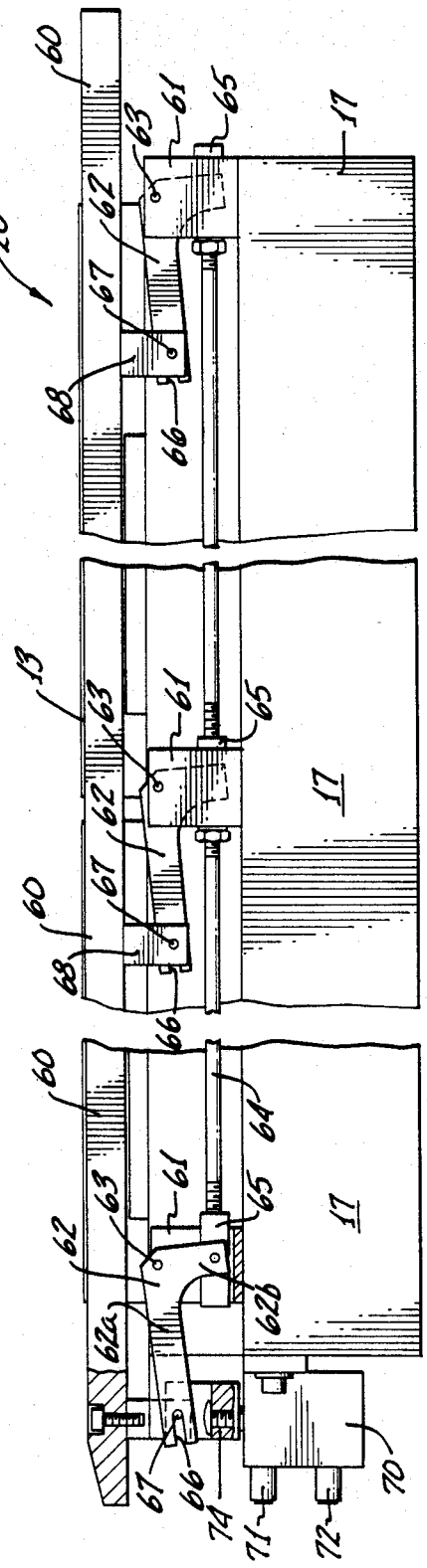
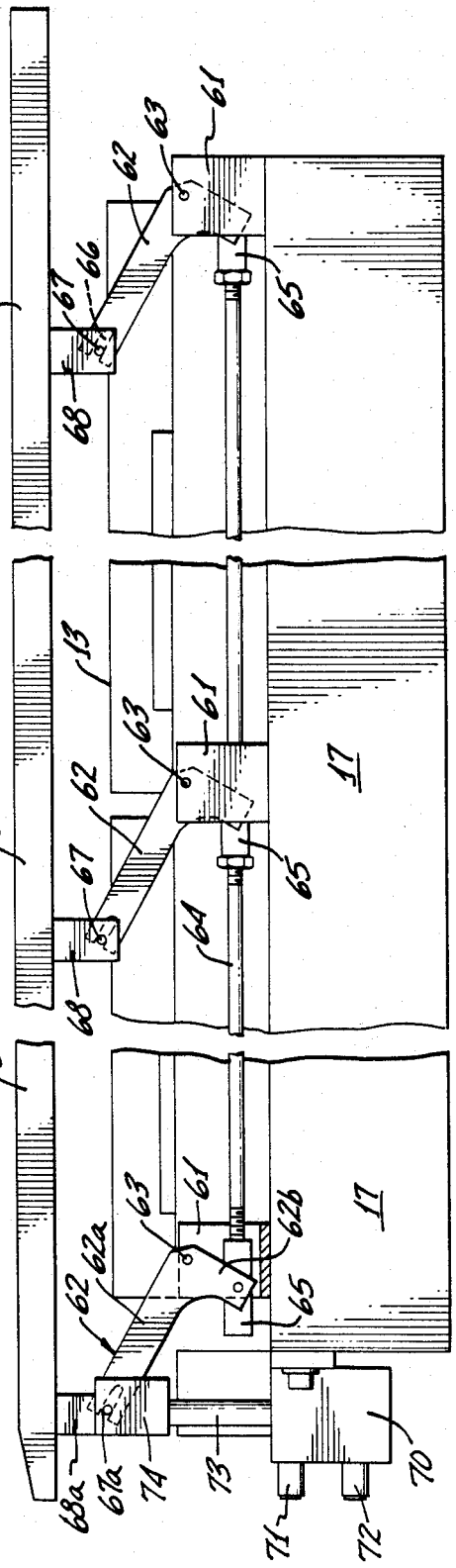

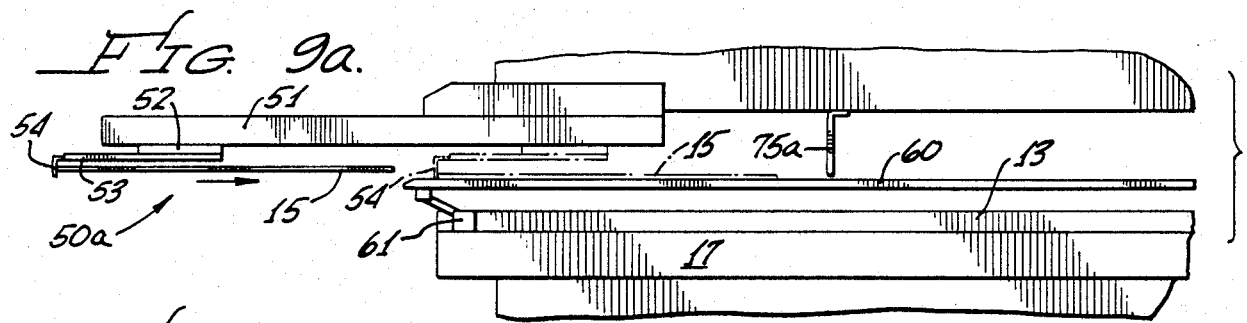
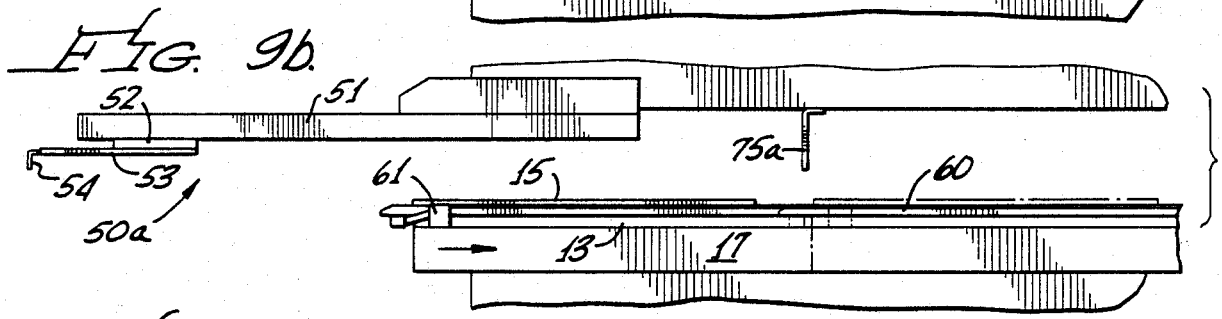
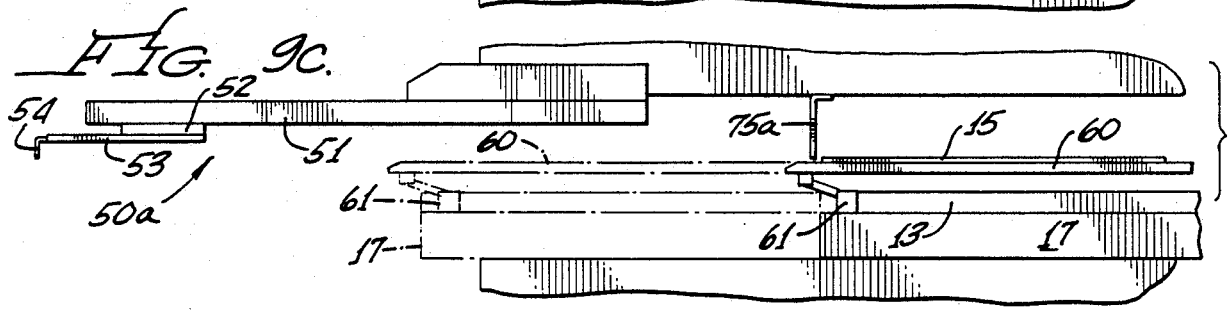
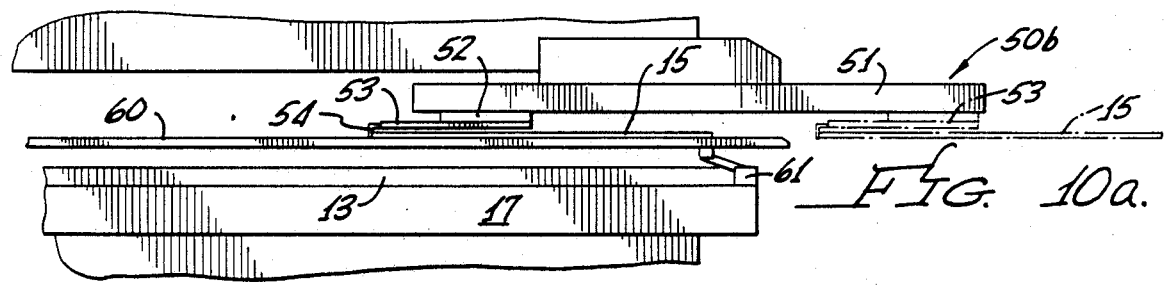
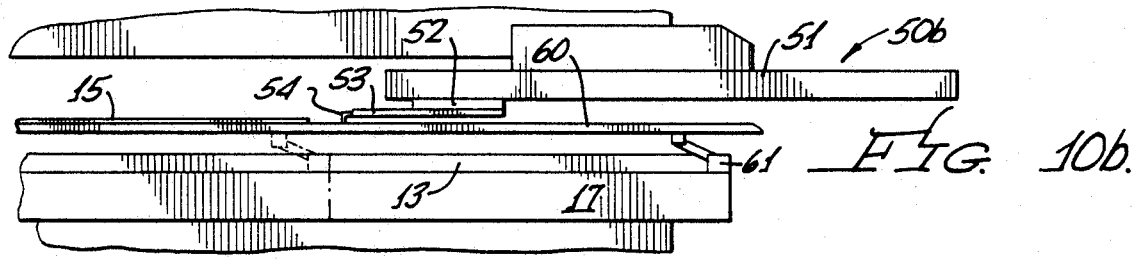
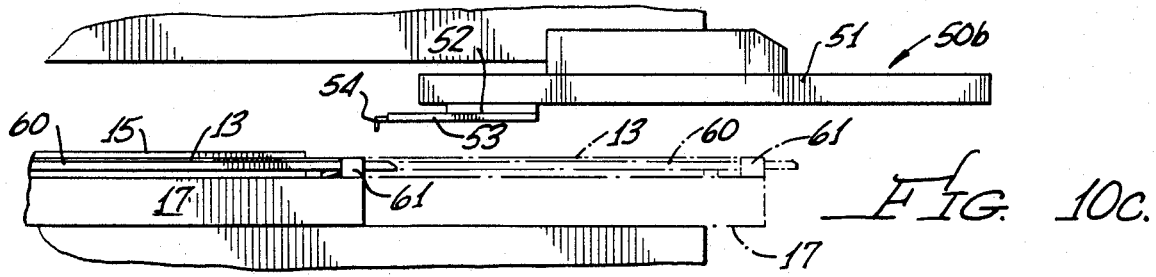

AUTOMATED WORK-PIECE HANDLING SYSTEM FOR MACHINE TOOL

This is a continuation of copending application Ser. No. 773,502, filed on Sept. 4, 1985, now abandoned, which in turn is a continuation of Ser. No. 470,457, filed Feb. 28, 1983, now abandoned.

BACKGROUND OF THE INVENTION

1. Field of the Invention

The present invention relates to an automated workpiece handling system for a machine tool and, more particularly, to a method and apparatus for transporting workpieces to, feeding workpieces onto, conveying workpieces along, feeding workpieces off of, and transporting workpieces from a machine tool.

2. Description of the Prior Art

Automated machinery is often used to perform a variety of operations on a workpiece, such as drilling and/or routing. A modern automated machine tool typically includes a plurality of workstations spaced along a movable worktable, with each of the workstations having an alignment device and a drilling and/or routing mechanism. The alignment device aligns and secures a workpiece, such as a group of printed circuit boards, to the worktable so that the drilling and/or routing operation can take place.

Previously, the workpieces have been inserted onto the alignment device of the individual workstations by hand. The machine tool then performs a programmed series of operations on the workpieces and the workpieces are manually removed upon completion of these operations. Thus, a typical automated machine tool requires the constant attention of a human operator.

The manual insertion and removal of workpieces from an automated machine tool is tedious work and can result in inefficient operation of the machine. Human labor is relatively expensive and should therefore be used for tasks which can best utilize the talents that a human operator has to offer. Furthermore, the manual handling of the workpieces can adversely affect the output efficiency of the machine because of the speed of the operator.

For some time, it has been recognized that a highly practical machine tool should have a fast, efficient system for bringing the workpieces to the workstations and for removing the workpieces after the operations are completed. It has been further recognized that such a system should operate in a relatively economical manner and should preferably not require any human labor. One attempt to provide an automated handling system for a machine tool is described and claimed in my copending application Ser. No. 236,844, filed Feb. 23, 1981, and entitled Handling System for an Automated Tooling Machine. Such handling system incorporates a transporter which carries the workpieces to the workstation of an automated tooling machine. The transporter incorporates a mechanism for feeding the workpieces onto the worktable at a selected workstation. The machine tool then incorporates a mechanism for carrying the workpieces from station to station.

The system of my copending application is relatively complex and since the loading mechanism is part of the transport means, the loading mechanism must be duplicated for each transport means and the transport means is complex and expensive. The conveyor belt system for moving the workpieces from station to station is also complex.

SUMMARY OF THE INVENTION

According to the present invention, there is provided an automated workpiece handling system for use with a machine tool which truly simplifies the process of transporting workpieces to and from, loading workpieces onto and off of, and moving workpieces along a machine tool. The present workpiece handling system is highly practical and is fast and efficient. The present workpiece handling system can operate economically without the intervention of any human labor.

Like the workpiece handling system of my copending application, the present workpiece handling system incorporates a cart for transporting workpieces to and from a machine tool. On the other hand, the present cart is a simple structure, having no loading equipment associated therewith. Because the cart is simple and light, many carts can be made at a low cost and the carts can be automatically transported to the machine tool. The loading and unloading mechanism is part of the machine tool so that it need not be duplicated. Furthermore, the mechanism for moving the workpieces along the machine tool partially uses the worktable itself so that the system for conveying the workpieces from station to station is also simple.

Briefly, the present automated workpiece handling system for use with a machine tool having a plurality of workstations spaced along a longitudinally movable, elongate worktable comprises a first cart for transporting workpieces to one end of the machine tool, adjacent a first workstation, a first feeder mechanism on the machine tool for drawing workpieces from the first cart and delivering the workpieces onto the worktable, a mechanism on the worktable, including the worktable itself, for moving the workpieces along the worktable from a position adjacent the first workstation to a position adjacent a final workstation, a second cart for transporting workpieces from the other end of the machine tool, adjacent the final workstation, and a second feeder mechanism on the machine tool for drawing workpieces from the worktable and delivering the workpieces onto the second cart.

OBJECTS, FEATURES AND ADVANTAGES

It is therefore the object of the present invention to solve the problems associated with automating the process of delivering workpieces to and receiving workpieces from a machine tool. It is a feature of the present invention to solve these problems by providing an automated workpiece handling system for use with a machine tool. An advantage to be derived is a highly practical, automated machine. A further advantage is a fast and efficient system for bringing workpieces to the workstations of a machine tool and removing the workpieces after the operations are completed. A still further advantage is an automated workpiece handling system for a machine tool which does not require the intervention of a human operator.

Still other objects, features and attendant advantages of the present invention will become apparent to those skilled in the art from a reading of the following detailed description of the preferred embodiment constructed in accordance therewith, taken in conjunction with the accompanying drawings wherein like numerals designate like or corresponding parts in the several figures and wherein:

BRIEF DESCRIPTION OF THE DRAWINGS

FIG. 6 is a top plan view of the worktable of the machine tool of FIG. 1;

FIGS. 7 and 8 are sectional views taken along the line 7—7 in FIG. 6 and showing the operation of the workpiece elevating and lowering rails;

FIGS. 9a, 9b and 9c are a series of simplified diagrams showing the loading of workpieces onto the worktable; and FIGS. 10a, 10b and 10c are a similar series of simplified diagrams showing the unloading of workpieces from the worktable.

DESCRIPTION OF THE PREFERRED EMBODIMENT

Figure 1:
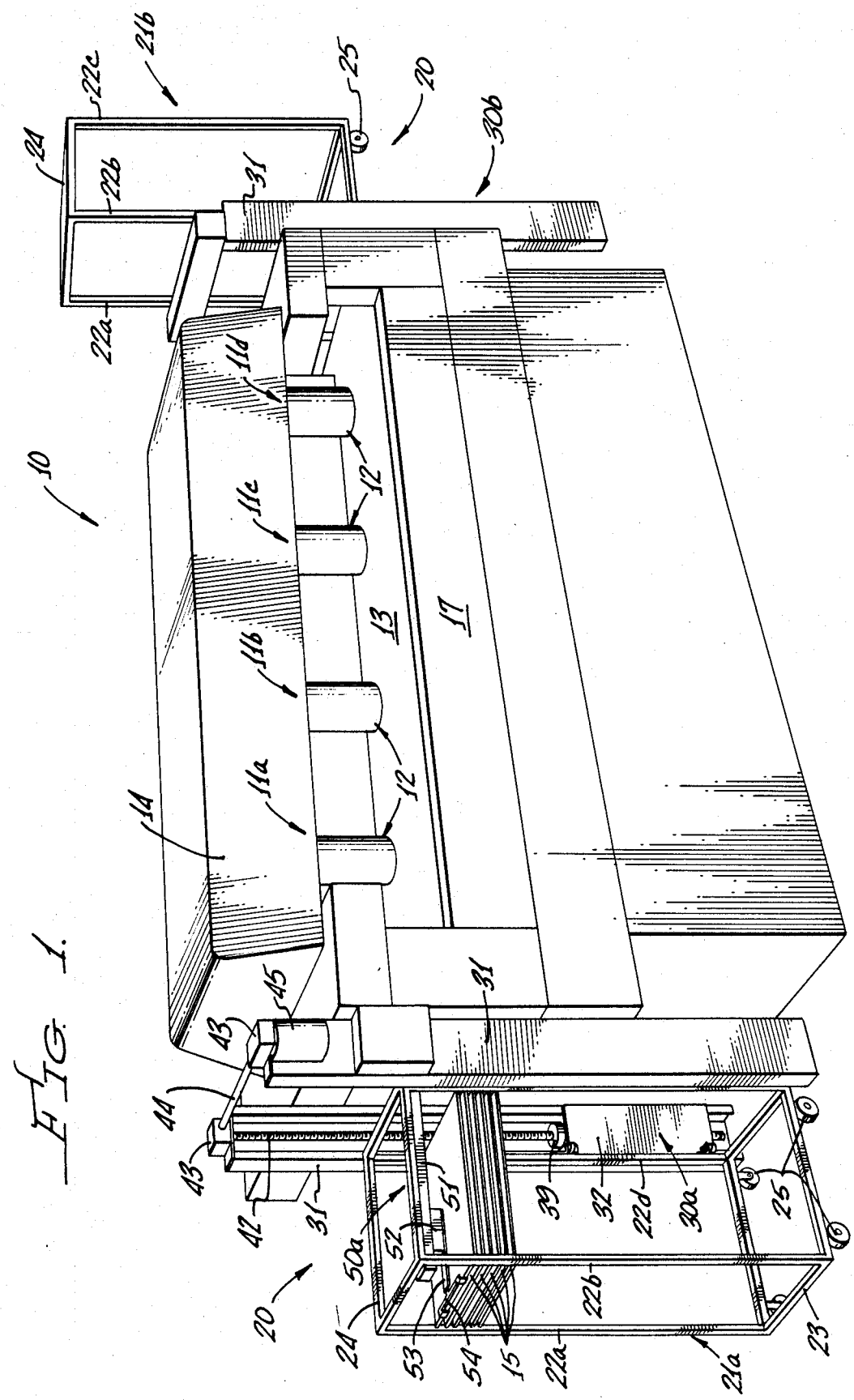
FIG. 1 is a perspective view of a machine tool incorporating the present automated workpiece handling system.
Figure 2:
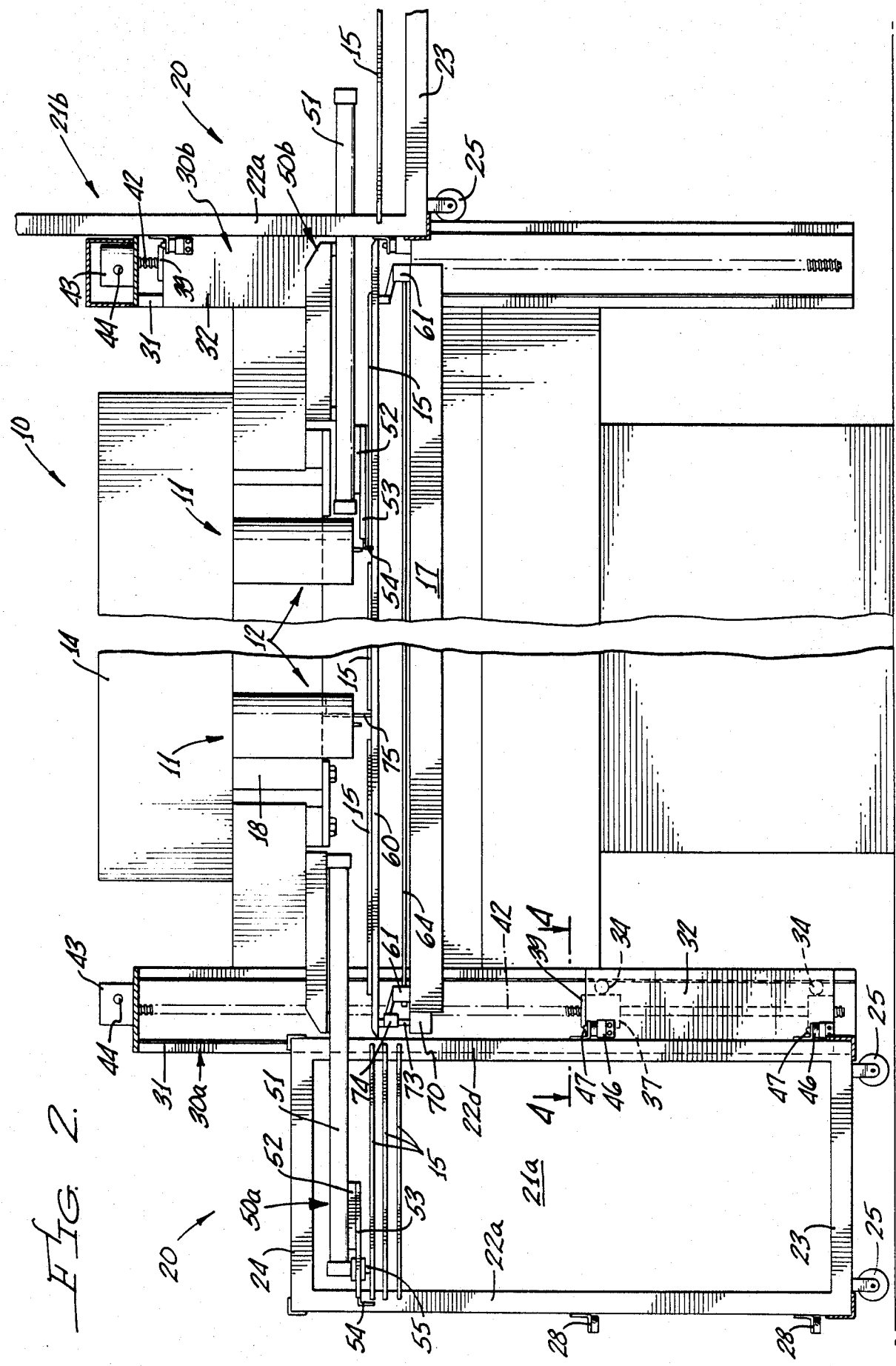
FIG. 2 is a front elevation view of the machine tool and automated workpiece handling system of FIG. 1.
Figure 3:
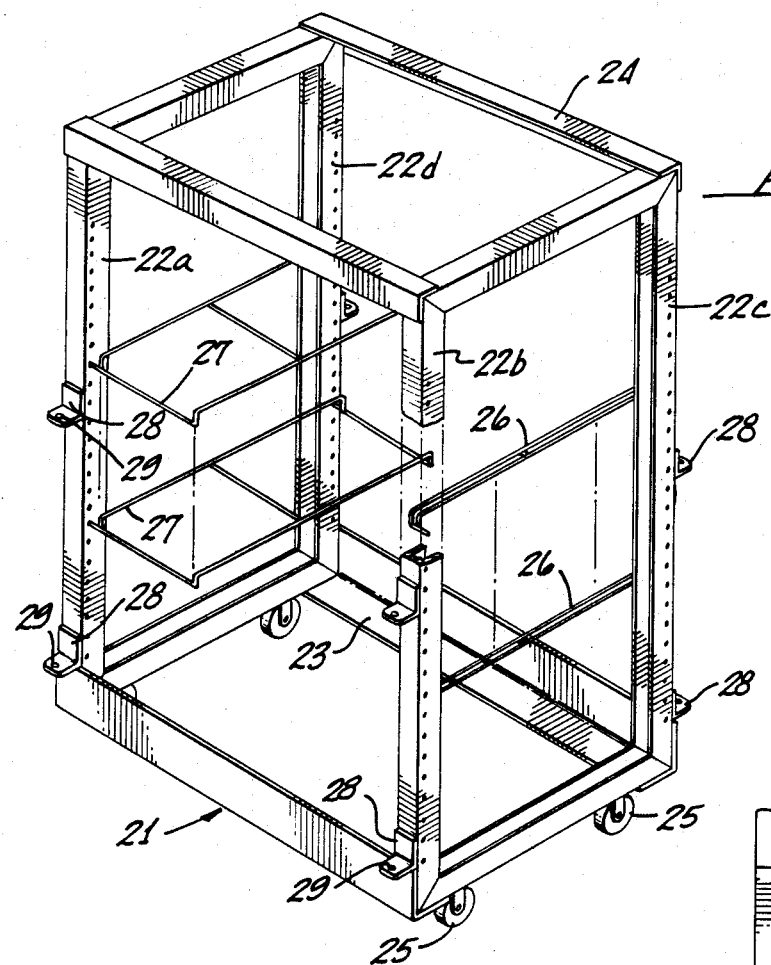
FIG. 3 is a perspective view of a cart which is part of the workpiece handling system of FIG. 1.
Figure 5:
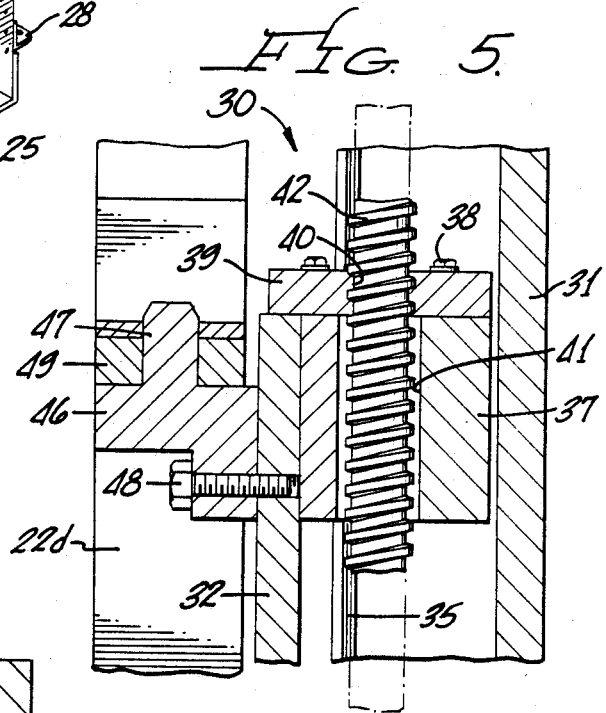
FIG. 5 is a sectional view taken along the line 5—5 in FIG. 4.
Figure 4:
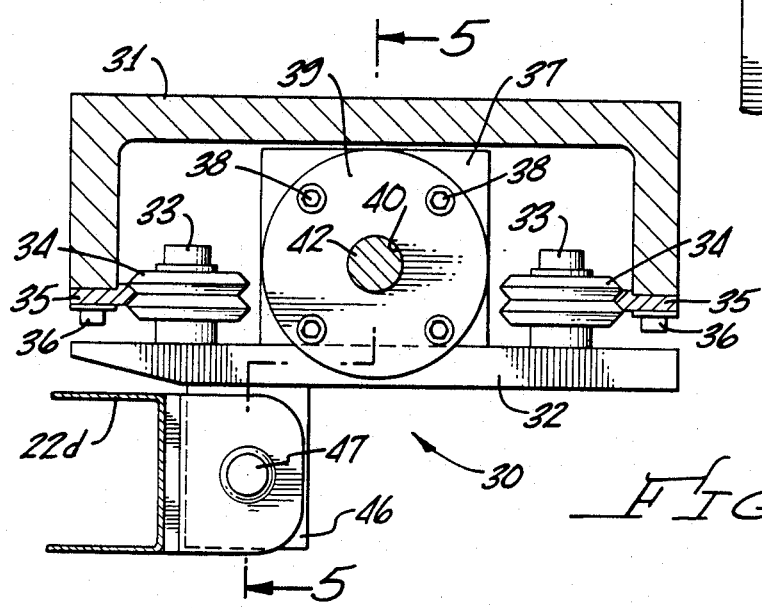
FIG. 4 is an enlarged sectional view taken along the line 4—4 in FIG. 2.

Referring now to the drawings and, more particularly, to FIGS. 1 and 2 thereof, there is shown a machine tool, generally designated 10, which has been modified to incorporate a workpiece handling system, generally designated 20, constructed in accordance with the teachings of the present invention. Because machine tool 10 is generally a conventional drilling/routing machine, only those portions thereof necessary for an understanding of workpiece handling system 20 will be described. Machine tool 10 is of the type having a plurality of workstations 11, each of which has a drilling or routing mechanism 12 positioned over a large worktable 13. A workpiece 15, which may consist of a stack of printed circuit boards, may be placed under each mechanism 12 on worktable 13. A control console (not shown), which usually contains a minicomputer, is typically programmed with a set of instructions for directing machine tool 10 to perform a series of drilling or routing operations on workpieces 15.

In a typical embodiment of a machine tool, and the embodiment incorporated herein, worktable 13, under the control of the control console, is movable longitudinally and the overhead assembly 14 on which mechanisms 12 are mounted is movable laterally to perform the necessary drilling and/or routing operations. In addition, the individual mechanisms 12 are movable in a direction perpendicular to worktable 13. In this manner, the workpieces 15 at the various workstations 11 may be simultaneously drilled and/or routed by mechanisms 12. After the machining operation is completed, the drills or routing tools are withdrawn from workpieces 15 and they may be removed from worktable 13. Machine tool 10 includes suitable drive means (not shown) for permitting the beforementioned longitudinal movement of worktable 13, lateral movement of overhead assembly 14, and the vertical movement of mechanisms 12. Suitable support structure is also provided, a discussion of which is not here considered relevant.

As mentioned previously, in prior automated machine tools, workpieces have been placed at the workstations by hand. After all of the machining operations were completed, the workpieces were also removed by hand. In order to eliminate the need for manual loading and unloading of the workpieces, workpiece handling system 20 has been added to machine tool 10.

Referring now to FIGS. 1-5, workpiece handling system 20 includes a plurality of transport means or carts 21. Carts 21 may be made from aluminum or other suitable metal material and include a generally rectangular frame comprising upright members 22a-22d, a base 23 and a top 24, base 23 including a plurality of wheels 25 so that cart 21 may be readily moved into and out of contact with machine tool 10. A first series of brackets 26 are connected between upright members 22b and 22c and a second series of brackets 27 are connected between upright members 22a and 22d, brackets 26 and 27 defining a plurality of vertically arranged shelves for supporting workpieces 15.

As described more fully in my copending application, the raw workpieces may be unmachined printed circuit boards which are stacked or grouped in groups of three or more, with each group secured together by alignment pins (not shown) which pass through the group of boards and protrude below the bottom board of each group. The groups of printed circuit boards (each group hereinafter referred to as a workpiece 15) are placed in a large stack vertically on the individual shelves. Brackets 26 include two parallel, spaced rails which receive one of the alignment pins, for location purposes, and the other alignment pin is supported by brackets 27. Bracket 27 is formed so as to receive workpieces 15 having different widths. Upright members 22a-22d each have a pair of L-shaped brackets 28 connected thereto in vertically spaced alignment, brackets 28 being connected to the individual upright members with the same vertical spacing.

Workpiece handling system 20 includes an elevator mechanism, generally designated 30, at each end of machine tool 10. Since the elevator mechanisms 30 at the opposite ends of machine tool 10 are identical, only the one at the left end of machine tool 10, designated 30a, which is used for feeding workpieces 15 onto worktable 13, will be described.

Elevator mechanism 30a includes a pair of opposed, vertically oriented, U-shaped channel members 31 which are positioned in parallel, spaced relationship, with the open sides of the channels facing each other. Each channel 31 supports, for vertical movement, a plate 32 which is positioned adjacent the open end of each channel 31. Plate 32 supports the ends of a plurality of shafts 33 on which rollers 34 are mounted for rotation, rollers 34 engaging tracks 35 secured to the open ends of channels 31. Tracks 35 may be connected to channels 31 by bolts 36. With such a construction, plates 32 are free to ride in a vertical direction along tracks 35.

Each plate 32 has secured thereto, on the inside surface thereof, at the top and bottom thereof, a pair of support blocks 37, which may be welded to plate 32. Each block 37, has connected thereto, by means of bolts 38, a disc 39 having an internally threaded hole 40. Support blocks 37 have aligned non-threaded holes 41. A threaded shaft 42 extends vertically within each channel 31, each shaft 42 engaging the upper and lower discs 39 of the associated plate 32. It should be evident that rotation of shafts 42 cause plates 32 to be driven upwardly and downwardly relative to channels 31.

The upper ends of the two shafts 42 of each elevator mechanism 30 terminate in mechanisms 43 where they are interconnected for simultaneous rotation by a shaft 44 driven by a motor 45 connected to one of mechanisms 43. In this manner, a single motor 45 drives the opposite plates 32 for simultaneous vertical movement. Each plate 32 has connected thereto, in vertically spaced relationship, a bracket 46 which supports an upwardly projecting pin 47. Brackets 46 may be connected to plates 32 by means of bolts 48. The spacing between brackets 46 is the same as the spacing between brackets 28 and brackets 28 have holes 29 therein for receipt of pins 47. Pins 47 may be partially surrounded by rubber washers 49.

In operation, it is seen that with plates 32 in their lowermost positions, a cart 21a may be moved into close proximity to machine tool 10 until upright members 22c and 22d are between the opposed plates 32. At this time, pins 47 would be in positions lower than brackets 28 and cart 21a can be wheeled forwardly until upright members 22c and 22d actually come into contact with brackets 46. At this time, motor 45 can be activated to drive plates 32 upwardly. As plates 32 move upwardly, the four pins 47 enter the four holes 29 in brackets 28, engaging same. Continued upward movement of plates 32 continues the upward movement of cart 21a therewith, for reasons which will appear more fully hereinafter. Suffice it to say that workpiece handling system 20 removes workpieces 15 from cart 20, one at a time, starting with the topmost workpiece 15.

As shown most clearly in FIGS. 1 and 2, an identical elevator mechanism 30b is connected to the opposite end of machine tool 10. While cart 21a at the lefthand side of machine tool 10 is shown in its lowermost position, the cart 21b at the other end of machine tool 10 is shown in its uppermost position. As will be described more fully hereinafter, workpiece handling system 20 removes workpieces 15 from worktable 13 and delivers them into cart 21b, filling the individual shelves of cart 21b from the bottom thereof. As workpieces 15 are removed from cart 21a, the cart 21a is driven upwardly. As workpieces 15 are delivered to the cart 21b, cart 21b is driven downwardly.

Workpieces 15 are drawn from cart 21a and delivered onto worktable 13 and are drawn from worktable 13 and delivered to cart 21b by identical feed mechanisms 50a and 50b. Feed mechanism 50a includes a hydraulic cylinder 51 having an internal piston (not shown) connected to a movable member 52 having connected thereto a ram 53. Ram 53 has the end thereof connected to a bracket 54 which engages the edge of workpieces 15. Upon activation of cylinder 51, member 52 is driven to the opposite end thereof whereupon bracket 54 engages a workpiece 15 and slides it either onto worktable 13 or off of worktable 13, as the case may be. The workpiece 15 at the top of the stack of cart 21a is considered to be at the "feed position" and is pushed by ram 53 onto worktable 13. A microswitch 55 may be positioned to sense the uppermost workpiece 15 as elevator mechanism 30a elevates the topmost workpiece 15 to the feed position.

It can therefore been seen that carts 21 are relatively simple members and that elevator mechanisms 30, in conjunction with feed mechanisms 50, both of which are permanent parts of machine tool 10, are fully operational in delivering workpieces 15 onto one end of machine tool 10, adjacent the first workstation, designated 11a, and for removing workpieces 15 from the other end of machine tool 10, adjacent the last workstation, designated 11d. All that remains to be described is an automatic mechanism for conveying each workpiece 15 along worktable 13, from workstation 11a, past the intermediate workstations, designated 11b and 11c, to workstation 11d.

Returning now to FIGS. 2, 6, 7 and 8, the mechanism for transporting workpieces 15 along worktable 13 comprises a pair of elongate, parallel, spaced rails 60 which are mounted on machine tool 10, adjacent worktable 13. More specifically, worktable 13 has a pair of elongate channels 16 therein in which rails 60 are mounted. As will be explained more fully hereinafter, rails 60 move longitudinally with worktable 13 and are adapted to be elevated or lowered for elevating workpieces 15 above worktable 13 or lowering workpieces 15 onto worktable 13. These two positions of rails 60 are shown in FIGS. 7 and 8. It will be seen from FIG. 7 that when in the lowered position, rails 60 are below worktable 13 so that workpieces 15 rest on worktable 13. In the elevated position of rails 60, as shown in FIG. 8, rails 60 are elevated above worktable 13 in position to elevate workpieces 15.

More specifically, machine tool 10 includes a movable base 17 on which worktable 13 and rails 60 are mounted. Mounted on base 17 are a plurality of support blocks 61. An L-shaped linkage 62 is supported for rotation by each block 61 by means of a pin 63 which extends through a central portion of linkage 62 and into block 61. Each linkage 62 includes a pair of legs 62a and 62b. The free ends of all of legs 62b are interconnected by means of a rod 64 and suitable connectors 65 which connect legs 62b to rod 64. The free ends of legs 62a have slots 66 therein through which extend pins 67. Pins 67 are connected to brackets 68 which are connected to rails 60.

A hydraulic cylinder 70 having input and output lines 71 and 72 is connected to one end of base 17, directly below one of the brackets 68a. Cylinder 70 drives a piston 73 which has a U-shaped bracket 74 connected to the end thereof, bracket 74 surrounding bracket 68a.

In the operation of rails 60, it should be evident from an inspection of FIGS. 7 and 8 that activation of cylinder 70 to drive pistons 73 outwardly to the position shown in FIG. 8 drives rails 60 upwardly, causing clockwise rotation of the first linkage 62. Rotation of the first linkage 62 causes simultaneous rotation of the remaining linkages 62 by means of the interconnection provided by rod 64 and connectors 65. The simultaneous rotation of each of linkages 62 causes elevation of the free ends of leg 62a and the elevation of rails 60 connected thereto. Activation of cylinder 70 in the opposite direction, to the position shown in FIG. 7, causes lowering of rail 60. While rails 60 could be lowered by gravity, it is preferable to provide a direct connection between pistons 73 and rails 60. Thus, the pins 67a which extend through the brackets 68a above pistons 73 also extend through brackets 74.

Referring to FIG. 2, the remaining element of the mechanism for moving workpieces 15 along worktable 13 comprises a plurality of wiper blades 75 which are connected to an overhead support member 18 of machine tool 10. As will be explained more fully hereinafter, blades 75 extend downwardly from support member 18 and extend laterally from one rail 60 to the other. Blades 75 are positioned so that they almost contact the upper surfaces of rails 60 when rails 60 are in their elevated positions. The reason for this will appear more fully hereinafter.

As described more fully in my beforementioned copending application, each workstation 11 has an alignment device which aligns and clamps the workpiece 15 at the workstation. This alignment device is not a portion of the present invention but will be described briefly in that it is an essential part of machine tool 10. A typical alignment device, generally designated 80, is shown in FIG. 6 and includes a stationary bar 81 mounted within a cavity 82 in worktable 13 and a bar 81a mounted within a cavity 82a in worktable 13 such that the top surfaces of bars 81 and 81a are flush with the top surface of worktable 13. Opposing bars 81 and 81a are movable bars 83 and 83a, respectively. Bars 83 and 83a are spaced from bars 81 and 81a, respectively, to form alignment slots 84 and 84a, respectively, therebetween. Bar 81a has a notch 85a therein which defines an alignment hole 86a between bars 81a and 83a. Alignment hole 86a is adapted to receive one of the alignment pins of a workpiece 15 and alignment slot 84 is adapted to receive another alignment pin.

As is well known in the art, before the alignment pins of the workpieces 15 are inserted into the alignment hole 86a and alignment slot 84, bars 83 and 83a are moved away from bars 81 and 81a, respectively, to an open position. The workpiece 15 is lowered by rails 60 onto the surface of worktable 13 so that the alignment pins are between bars 81 and 83 and 81a and 83a, respectively. Bars 83 and 83a are then moved back toward bars 81 and 81a, respectively, to a closed position with the alignment pins clamped between bars 81 and 83 and within the alignment hole 86a. In this manner, the workpieces 15 are aligned and secured relative to worktable 13. The movable bars 83 and 83a may be moved into their open and closed positions by suitable hydraulic mechanisms (not shown) well known to those skilled in the art.

The operation of workpiece handling system 20 for drawing workpieces 15 from cart 21a and delivering workpieces 15 onto worktable 13 and for subsequently transporting workpieces 15 from workstation 11a to workstation 11b, then to workstation 11c, and then to workstation 11d, can best be understood with reference to FIGS. 9a through 9c. Subsequently, the manner in which workpieces 15 may simultaneously be delivered from workstation 11d onto cart 21b will be described with reference to FIGS. 10a through 10c.

Referring first to FIG. 9a, it will be understood that through conventional means (not shown), worktable 13, base 18 and rails 60 have the capability of being moved longitudinally by an amount equal to the spacing between workstations 11. When it is initially desired to deliver a workpiece 15 from cart 21a onto worktable 13, worktable 13 is moved to its extreme left position, rails 60 are elevated and ram 53 of feed mechanism 50a is also moved to its extreme left position, all of these positions being shown in solid lines in FIG. 9a. Elevator mechanism 30a is activated to drive cart 21a upwardly until the uppermost workpiece 15 contacts switch 55. At this time, cylinder 51 is activated and ram 53 is driven to its rightmost position, shown in phantom in FIG. 9a, moving the uppermost workpiece 15 onto elevated rails 60.

At this time, rails 60 are lowered to deposit workpiece 15 onto worktable 13, at a delivery position to the left of workstation 11a. These positions of worktable 13 and rails 60 are shown in solid lines in FIG. 9b. At this time, worktable 13 is driven to its rightmost position, as shown in phantom in FIG. 9b. Workpiece 15 moves with worktable 13, below the first wiper blade 75a. The new position of workpiece 15 is also shown in phantom in FIG. 9b.

At this time, rails 60 are elevated, elevating workpieces 15 above worktable 13. This position of worktable 13 and rails 60 is shown in solid lines in FIG. 9c. At this time, worktable 13 is driven to its extreme left position, rails 60 moving therewith, these positions of worktable 13 and rails 60 being shown in phantom in FIG. 9c. It should be apparent that since wiper blades 75 are now in the path of workpieces 15, workpieces 15 are held stationary as worktable 13 and rails 60 move. Thus, workpiece 15 remains at a position between workstation 11a and workstation 11b.

It will be immediately apparent that worktable 13 and rails 60 have now returned to their initial positions, as shown in solid lines in FIG. 9a. In this position, another workpiece 15 can be delivered onto rails 60 and worktable 13. This procedure can now be repeated until four workpieces 15 have been loaded onto worktable 13 and shifted to workstations 11a, 11b, 11c, and 11d. It should be particularly noted that the shifting of workpieces 15 is done entirely by worktable 13 and no separate conveying assembly is required.

At this time, drilling or routing mechanisms 12 may be activated to perform whatever work operation is required on workpieces 15. When it is time to remove workpieces 15 from worktable 13 and load new workpieces 15 onto worktable 13, worktable 13 is moved to its extreme right position and rails 60 are elevated, as shown in solid lines in FIG. 10a. Elevator mechanism 30b is activated to lower cart 21b to a position where the uppermost empty shelf is in its receive position. The cylinder 51 associated with feed mechanism 50b may then be activated to drive the associated ram 53 to the right, to the position shown in phantom in FIG. 10a. In this position, the ram 53 drives the workpiece 15 into cart 21b.

With rails 60 still elevated, as shown in solid lines in FIG. 10b, worktable 13 is driven to the left, rails 60 moving therewith, to the position shown in phantom in FIG. 10b. Recall that under these circumstances, which are also shown in FIG. 9c, the workpieces 15 are held stationary by wiper blades 75 so that after a time, these workpieces are also shifted one position to the right. A new workpiece 15 may now be loaded onto worktable 13, as described previously with regard to FIG. 9a. Then, rails 60 may be lowered and worktable 13 moved to the right, from the positions shown in solid lines in FIGS. 9b and 10c to the positions shown in phantom in these same figures. At this time, rails 60 may be elevated to the positions shown in solid lines in FIG. 10a and the next workpiece 15 removed from worktable 13. This procedure may be repeated four times so that the four workpieces that have been previously drilled or routed are removed from worktable 13 while four new workpieces 15 are simultaneously moved onto worktable 13.

It can therefore be seen that according to the present invention, there is provided an automated workpiece handling system 20 for use with a machine tool 10 which truly simplifies the process of transporting workpieces 15 to and from, loading workpieces 15 onto and off of, and moving workpieces 15 along machine tool 10. Workpiece handling system 20 is highly practical and is fast and efficient. Workpiece handling system 20 can operate economically, without the intervention of any human labor.

Like the workpiece handling system of my copending application, workpiece handling system 20 incorporates a cart for transporting workpieces 15 to a machine tool. On the other hand, cart 21 is a highly simple structure, having no loading equipment associated therewith. Because cart 21 is simple and light, many carts 21 can be made at a low cost and carts 21 can even be automatically transported to machine tool 10. The loading/unloading mechanism is a permanent part of machine tool 10 so that it need not be duplicated. Furthermore, the mechanism for moving workpieces 15 along machine tool 10 partially uses worktable 13 itself so that the system for conveying workpieces 15 from station to station is highly simple.

While the invention has been described with respect to the preferred physical embodiment constructed in accordance therewith, it will be apparent to those skilled in the art that various modifications and improvements may be made without departing from the scope and spirit of the invention. Accordingly, it is to be understood that the invention is not to be limited by the specific illustrative embodiment, but only by the scope of the appended claims.

I claim:

1. An automated machine tool system comprising:
    a machine tool having a plurality of workstations spaced along a longitudinally movable worktable, wherein automated machining operations are performed on workpieces at each workstation;
    first transport means for transporting workpieces to one end of said machine tool, adjacent a first workstation;
    first feeder means on said machine tool for (a) engaging workpieces on the first transport means, (b) drawing workpieces from said first transport means and delivering said workpieces onto said worktable, and (c) disengaging the workpieces after delivery to the worktable;
    means for facilitating the shifting of workpieces to different workstations along the worktable, said means including means for maintaining the workpieces stationary while the worktable is moved in a first longitudinal direction thereby to shift each workpiece to an adjacent workstation;
    means for selectively elevating workpieces above said worktable and lowering workpieces onto said worktable; and
    means connected to said machine tool for engaging said workpieces when elevated above said worktable for preventing movement of said workpieces with said worktable as said worktable moves longitudinally whereby movement of said worktable with said workpieces elevated shifts said workpieces along said worktable.

2. A system according to claim 1, wherein said means for selectively elevating and lowering workpieces comprises:
    a pair of elongate, parallel, spaced rails mounted on said machine tool, adjacent said worktable; and
    means for selectively elevating and lowering said rails.

3. A system according to claim 2, wherein said workpieces engaging means comprises:
    a plurality of blades connected to said machine tool and extending downwardly, transverse to said worktable to a position in the path of said workpieces when said workpieces are elevated above said worktable.

4. A system according to claim 1, wherein said workpieces engaging means comprises:
    a plurality of blades connected to said machine tool and extending downwardly, transverse to said worktable to a position in the path of said workpieces when said workpieces are elevated above said worktable.

5. A system according to claim 1, further comprising:
    second transport means for transporting workpieces from the other end of said machine tool, adjacent a final workstation; and
    second feeder means on said machine tool for drawing workpieces from said worktable and delivering said workpieces onto said second transport means.

6. A system according to claim 5, wherein said second transport means is identical to said first transport means.

7. A system according to claim 5, wherein said first feeder means comprises:
    a first positioning ram on said machine tool for moving workpieces from said first transport means onto said worktable.

8. A system according to claim 7, wherein said second feeder means comprises:
    a second positioning ram on said machine tool for moving workpieces from said worktable to said second transport means.

9. A system according to claim 5, wherein each of said transport means comprises:
    a frame;
    a plurality of brackets connected to said frame and positioned to define a plurality of vertically arranged shelves for supporting workpieces; and
    connector means connected to said frame for permitting the removable connection of said frame to said worktable.

10. A system according to claim 9, further comprising:
    first elevator means connected to said machine tool for engaging said connector means of said first transport means; and
    first drive means for vertically driving said first elevator means so as to elevate said first transport means to bring each of said shelves thereof sequentially to a feed position where said first feeder means draws the workpiece on said shelf at said feed position from said first transport means and delivers said workpiece onto said worktable.

11. A system according to claim 10, further comprising:
    second elevator means connected to said machine tool for engaging said connector means of said second transport means; and
    second drive means for vertically driving said second elevator means so as to elevate said second transport means to bring each of said shelves thereof sequentially to a receiving position where said second feeder means draws a workpiece from said worktable and delivers said workpiece onto said shelf at said receiving position of second transport means.

12. A system according to claim 11, wherein said first feeder means comprises:
    a first positioning ram on said machine tool for moving workpieces at said feed position of said first transport means to said worktable.

13. A system according to claim 12, wherein said second feeder comprises:
    a second positioning ram on said machine tool for moving workpieces from said worktable onto said second transport means.

* * * * *